US007567015B2

(12) United States Patent
Cheng et al.

(10) Patent No.: US 7,567,015 B2
(45) Date of Patent: Jul. 28, 2009

(54) COMPOSITE MODE TRANSDUCER AND COOLING DEVICE HAVING THE COMPOSITE MODE TRANSDUCER

(75) Inventors: Syh-Yuh Cheng, Hsinchu Hsien (TW); Yun-Tien Chen, Hsinchu (TW); Ra-Min Tain, Hsinchu (TW); Shu-Jung Yang, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 11/594,832

(22) Filed: Nov. 9, 2006

(65) Prior Publication Data

US 2007/0205690 A1 Sep. 6, 2007

(30) Foreign Application Priority Data

Mar. 3, 2006 (TW) .............................. 95107132 A

(51) Int. Cl.
*H01L 41/08* (2006.01)

(52) U.S. Cl. ...................................................... 310/321

(58) Field of Classification Search ................. 310/320, 310/321

See application file for complete search history.

(56) References Cited

U.S. PATENT DOCUMENTS

| | | | | |
|---|---|---|---|---|
| 3,185,943 | A * | 5/1965 | Honda et al. | 333/189 |
| 3,189,852 | A * | 6/1965 | Tsuchiya | 333/197 |
| 3,369,200 | A * | 2/1968 | Hans Albsmeier et al. | 333/197 |
| 3,515,914 | A * | 6/1970 | Steinemann | 310/37 |
| 4,368,402 | A * | 1/1983 | Torii et al. | 310/367 |
| 6,247,525 | B1 | 6/2001 | Smith et al. | |
| 6,713,942 | B2 | 3/2004 | Raman et al. | |
| 2007/0013270 | A1 * | 1/2007 | Sashida et al. | 310/348 |

FOREIGN PATENT DOCUMENTS

| | | | |
|---|---|---|---|
| GB | 814123 | * | 5/1959 |
| JP | 11-271241 | * | 10/1999 |
| JP | 2002-134975 | A | 5/2002 |
| JP | 2003-211033 | A | 7/2003 |
| JP | 2003-259923 | A | 9/2003 |
| TW | 451045 | | 12/1989 |
| TW | 1235907 | | 3/1993 |
| TW | 200534776 | | 4/1993 |

* cited by examiner

*Primary Examiner*—Thomas M Dougherty
(74) *Attorney, Agent, or Firm*—Birch, Stewart, Kolasch & Birch, LLP

(57) ABSTRACT

A composite mode transducer for dissipating heat generated by a heat generating element is disclosed. The composite mode transducer includes a transducing module and connection elements. The transducing module includes first and second transducing elements connected in parallel. The connection elements are connected to resonance nodes of the first and second transducing elements. The first and second transducing elements are driven by a multiple-frequency resonance circuit, to produce resonance vibration of composite modes at resonance vibration frequencies of the system. The resulting advantages by using the composite mode transducer are: elimination of local stress concentration, and enhancement of efficiency, endurance and stability of the system. Accordingly, drawbacks of the prior art are overcome. The present invention further provides a cooling device with the composite mode transducer.

8 Claims, 5 Drawing Sheets

COMPOSITE MODE TRANSDUCER AND COOLING DEVICE HAVING THE COMPOSITE MODE TRANSDUCER

BACKGROUND OF THE INVENTION

1. Field of the Invention

This invention relates to transducing devices, and more particularly, to a composite mode transducer and a cooling device having the composite mode transducer.

2. Description of Related Art

A cooling system has come to the market for many years. In general, a device in motion generates heat. Such the heat makes a great impact on the operation of elements of the device. In a mechanical process such as a drilling process or a lathe cutting process, tools such as a cutting knife are easily expanded due to heat resulted from friction. In result, the size of the expanded cutting knife is changed, and the cutting knife cannot cut an element accurately. In order to ensure the cutting knife can cut the element accurately all the time, cutting fluid have to be applied to a cutting region, to dissipate the heat to a region from the cutting region. Similarly, the heat also makes a great impact on electronic components of an electronic device. Therefore, a cooling system for dissipating the heat to another region is not only necessary for the mechanical process, but is also crucial for a computer system, which comprises a plurality of electronic elements.

When the computer system is in operation, a central processing unit (CPU) or a graphics processing unit (GPU) of the computer system generates heat. In order to ensure that the computer system is operating within a specification temperature range required by a computer system manufacturer, the heat generated by the CPU or the GPU has to be dissipated to a region outside of the computer system as efficiently as possible. An air cooling mechanism including a fan and a heat-sink thermal module is one of the most popular air cooling systems in the art. In operation, the heat sink base of the thermal module are installed in contact with a heat source of an electronic device for conducting heat generated by the heat source to the heat-sink, and the fan exchanges cool air in a region outside of heat-sink with hot air in another region inside of the heat-sink, so as to reduce the temperature of an environment in which the electronic device is operating. A liquid cooling mechanism having cooling liquid is another one of the most popular cooling systems in the art. The liquid cooling mechanism takes the use of a closed-loop system to directly or indirectly contact and exchange heat with the heat source by circulating the cooling liquid.

The air cooling mechanism is still efficient enough to dissipate heat generated by a CPU, if the CPU is not operating at too high frequency. However, every 18 months a new generation CPU will come to the market, the new generation CPU having, according to Moore's law, double the number of transistors that an old generation CPU has. The new generation CPU runs much faster than the old one, and generates much more heat accordingly. The liquid cooling mechanism, which has a heat-dissipating efficiency better than that of the air cooling mechanism, is therefore widely applied to an electronic device having the new generation CPU in recent years. In early days, the air cooling mechanism dominates the cooling system market. Taiwan Patent No. 1235,907 discloses an air cooling mechanism, which operates in accordance with a temperature detecting circuit and a control circuit. As the CPU runs faster and faster and has a smaller die size, the CPU power density will increase and heat dissipation may become a problem.

According to the description of Taiwan Publication No. 200534776, cooling liquid is first guided to flow into a heat absorber to exchange heat with the heat absorber. Then the cooling liquid is pumped by a circulation pump to flow into a heat condenser to exchange itself with air in the heat-dissipating pipe. Taiwan Patent No. 451,045 also discloses a similar liquid cooling mechanism, which takes the use of an indoor heat exchanger to exchange waste heat with an outdoor air and a mist formed by vibrating the cooling liquid, to increasing the area on which a heat-exchanging process is performed and improve the performance of a heat-exchanging process.

Since the above-mentioned cooling mechanisms are still not efficient enough to dissipate the heat generated by the CPU, U.S. Pat. No. 6,713,942 B2, and Japan Patent No. 2002134975 and 200264599 as well, discloses a piezoelectric fan having a plurality of piezoelectric components. The piezoelectric fan is used for cooling heat-generating components, all of which have compact sizes and high power density, of a portable device, such as a notebook computer, a cellular phone or a digital camera. Similarly, Japan Patent No. 200261173 also discloses a cooling mechanism, which controls vibration boards of a piezoelectric fan to vibrate, so as to spray the cooling liquid onto the heat-dissipating components and cool the heat-dissipating components in result. A modern cooling system composed of a piezoelectric transducing device has a plurality of advantages, such as a compact volume, a simplified structure and a low power consumption, and has been widely applied to a variety of arts such as a computer system. For example, U.S. Pat. No 6,247,525 B1, as shown in FIG. 1, discloses that a driver 16 drives through a plurality of wires 14 a piezoelectric actuator 13 adhered to a bottom surface 12 of a diaphragm 15 to generate an ultrasonic vibration for atomizing mobile liquid droplets 19 flew from a fluid injection region 17 via a dispenser 18. The atomized liquid droplets 19 exchange heat with a heat-generating surface, and are cooled and condensed by a plurality of heat-dissipating fins and flow along a pipe back to an oscillation region, for a next action.

However, the piezoelectric actuator 13 is generally operating at a resonance frequency, and has a higher vibration power due to an influence of a resonance mode, so the piezoelectric actuator 13 has a greater atomized volume and a better heat-dissipating efficiency. Accordingly, when the piezoelectric actuator 13 is operating at the resonance frequency, components of the piezoelectric actuator 13 have lower resistances, and the piezoelectric actuator 13 has a larger electro-mechanical energy conversion ratio and can generate a larger atomized volume. However, the resonance frequency of the piezoelectric actuator is easily influenced by an environment such as a temperature, the variation of a boundary condition, or a package manufacturing process, so the resonance frequency has a problem for selection of fixed points, which is closely related to the performance of an atomization process. Moreover, the interference due to the diversity of moving directions of the piezoelectric actuators, which are all adhered to a single diaphragm, cause stress forces to be converged in a certain region of the diaphragm, and reduces durability, stability and working efficiency of the system. Furthermore, the resonance frequencies having thickness directions of the single piezoelectric actuator are located sparsely, so it is hard to design a control circuit and utilize their resonance characteristics, reducing the system usability.

Therefore, it is becoming one of the most important errands in the art to solve the above-mentioned problems and develop a transducing device and a cooling device having the transducer, so as to provide resonance frequencies closer in the thickness direction, simplify the design and increase the controllability of the system, prevent the convergence of stress forces and improve the durability by adjusting the particle sizes of the atomized liquid droplets in accordance with the variation of temperature, improve the heat dissipating efficiency, and prevent any environment factor from affecting the heat exchanging efficiency.

SUMMARY OF THE INVENTION

The present invention provide a composite mode transducer and a cooling device having the composite mode transducer, so as to simplify the structure and reduce the difficulty when designing a composite mode resonance.

The present invention also provide a composite mode transducer and a cooling device having the composite mode transducer, so as to connect to the transducing structure to nodes, without influenced by an effect performed by boundary conditions on the composite mode operation.

The present invention further provide a composite mode transducer and a cooling device having the composite mode transducer, which adopts a resonance multiple frequency circuit to drive.

The composite mode transducer includes a transducing module having a first transducing element and a second transducing element, for transforming input powers into vibration outputs in a thickness direction; and a connection element connected to resonance nodes of the first and second transducing elements for conducting the first and second transducing elements, and composing modes generated by the first and second transducing elements into a system resonance mode. The transducing element is a piezoelectric body. According to a preferred embodiment, the transducing element includes a piezoelectric body and a metal plate adhered to the piezoelectric body by a thermosetting gel or a UV gel, so as to reduce the frequency of resonance nodes. The connection element is made of rigid metal material. According to a preferred embodiment, the connection element is made of rigid metal conductive material, and is used for electrically connecting the first transducing element to the second transducing element.

The composite mode transducer further includes a multiple-frequency resonance circuit for outputting one selected from the group consisting of a resonance frequency of the first transducing element, a resonance frequency of the second transducing element, a frequency by the resonance frequency of first transducing element from the resonance frequency of the second transducing element, and a frequency by adding the resonance frequency of the first transducing element to the resonance frequency of the second transducing element. Preferably, the multiple-frequency resonance circuit is designed in accordance with resonance nodes of the transducing elements of the system after the transducing elements are composed. The multiple-frequency resonance circuit further drives the first and second transducing element, so as to generate an atomized effect of composite mode.

A cooling device having a composite mode transducer is further provided according to the present invention. The cooling device includes a heat exchange module for accommodating liquid to be atomized and providing a space for exchanging heat; and a composite mode transducer connected to a side of the heat exchange module for oscillating the liquid accommodated in the heat exchange module, and absorbing the heat generated by the heat generating element with atomized liquid, the composite mode transducer including a transducing module having a first transducing element and a second transducing element in parallel with the first transducing element for transforming input power into output vibration in a thickness direction, and a connection element connected to the resonance nodes of the first and second transducing elements for conducting the first and second transducing elements and composing modes generated by the first and second transducing elements into a system resonance mode.

The heat exchange module includes an accommodation unit, a liquid to be atomized for heat exchanging, and an injection region. The heat exchange module is adhered to a surface of the heat generating element. According to a preferred embodiment, a heat conducting gel (thermal interface material) is adhered to a surface of the heat generating element, a heat sink is installed on an external surface of the heat exchange module, and a metal fixing ring is used for clamping the heat sink to the heat exchange module. The transducing module atomizes the liquid accommodated in the accommodation unit and takes the atomized liquid as heat exchanging medium.

Moreover, the heat exchange module further includes a level switch component for preventing the leakage of the liquid, so as to protect the composite mode transducer from burning.

Therefore, by the installation of the transducing module having the first transducing element and the second transducing element in parallel with the first transducing element, the connection element connected between a plurality of transducing element nodes, and the heat exchange module installed on a side of the composite mode transducer, the system, if operates in a high temperature environment, adopts lower composite frequency to drive the composite mode transducing module to generate liquid droplets having larger particles, such a resonance frequency consuming more power but dissipating more heat. The system, if operates in a low temperature environment, adopts higher composite frequency to drive the composite mode transducing module to generate liquid droplets having smaller particles, to dissipating less heat but consuming less power.

Since the composite mode transducer and the cooling device having the composite mode transducer disclosed by the present invention mainly includes a transducing module having a first transducing element and a second transducing element in parallel with the first transducing element, a connection element connected between resonance nodes of the first and second transducing elements, and a heat exchange module installed on a side of the composite mode transducer, and makes the use of a multiple-frequency resonance circuit to drive the first and second transducing elements and the connection of the first and second transducing elements, the present invention can generate four resonance frequencies in the thickness direction, including the resonance frequencies of the two transducing elements, and an addition and a subtraction of the resonance frequencies of the two transducing elements, and generates different transducing module composite modes. Moreover, the present invention takes the use of mechanical vibrations in the thickness direction of the different transducing modules to generate atomized liquid droplets having a certain disposition, and sprays the formed micro-droplets onto a heat generating surface. Alternatively, the present invention takes the use of a flexible pipe, in accordance with an installation of a pressure region such as a fan, to convey the atomized liquid droplets, and a spray nozzle to spray the conveyed atomized liquid droplets onto the heat generating surface, to perform a latent heat exchange with these micro-droplets. Therefore, the atomized liquid droplets can have different particle sizes in accordance with varied temperature, thereby increasing the heat exchanging efficiency and preventing environment factors from affecting the system. The resonance effect of a composite mode formed by the connection of the first and second transducing elements prevents stress forces from converging on certain regions, so as to promote system working efficiency and working stability.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention. The present invention can also be performed or applied by other different embodiments. The details of the specification may be on the basis of different points and applications, and numerous modifications and variations can be devised without departing from the spirit of the present invention.

Figure 1:
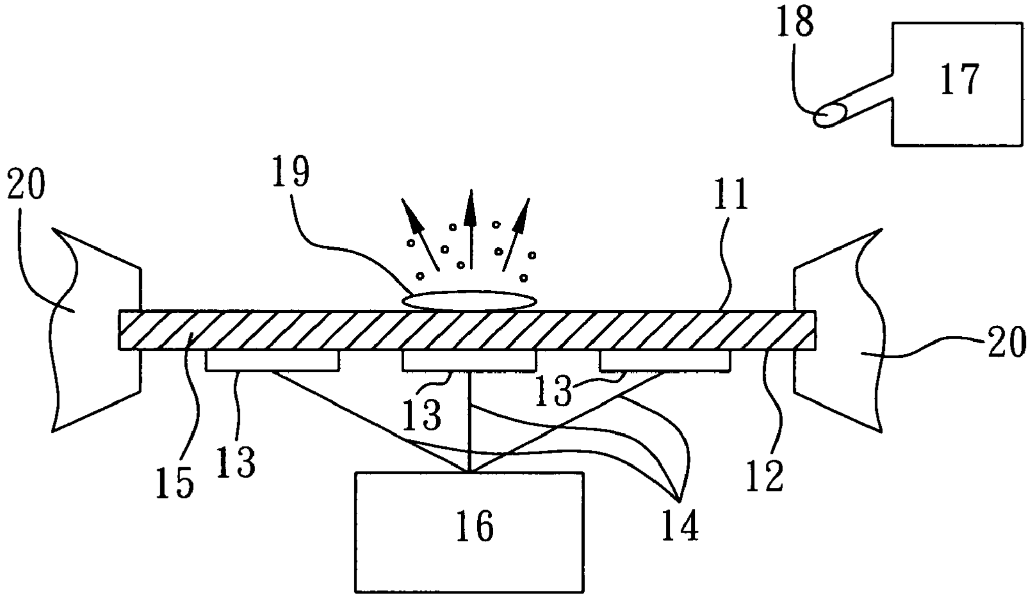
FIG. 1 is a schematic diagram of a device for piezoelectrically vibrating atomized liquid droplets according to the prior art.
Figure 2A:
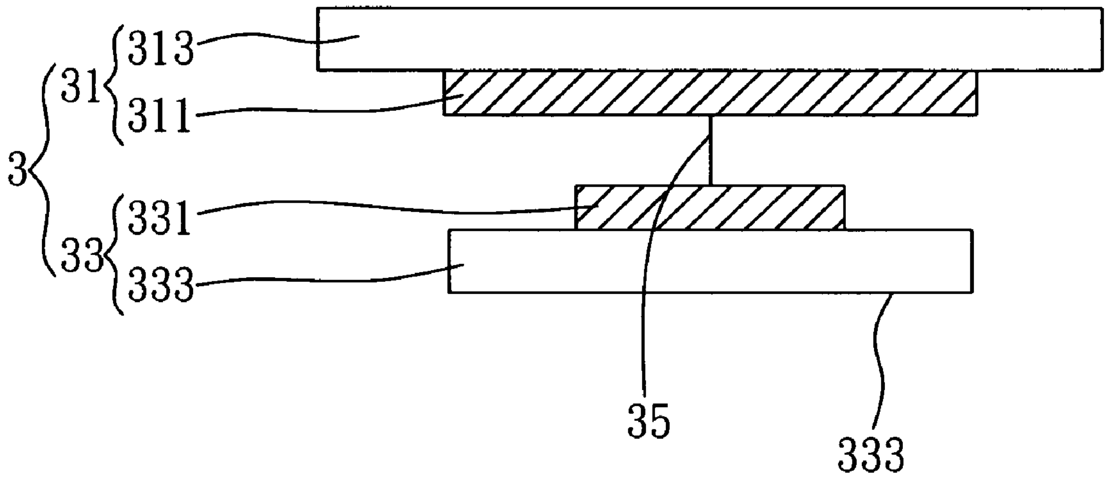
FIG. 2*a* is a cross sectional view of a composite mode transducer of the present invention.

Please refer to FIG. 2*a*, which is a schematic diagram of a composite mode transducer of the present invention. The composite mode transducer comprises a transducing module 3 having a first transducing element 31 and a second transducing element 33 in parallel with the first transducing element 31, and a connection element 35 connected to standing points (resonance nodes) of the first and second transducing elements 31 and 33 when the first and second transducing elements 31 and 33 are in resonance. A first piezoelectric transducer 311 of the first transducing element 31 is adhered to a top metal flat board 313 by an agglutination unit 4 (shown in FIG. 3). A second piezoelectric transducer 331 of the second transducing element 33 is adhered to a bottom metal flat board 333 also by the agglutination unit 4. The agglutination unit 4 is preferably selected from the group consisting of a thermosetting gel and an ultraviolet (UV) gel. The rigid metal conductive connection element 35 is connected between the standing points of the first piezoelectric transducer 311 and the second piezoelectric transducer 331 and is in the form of a character "I", for preventing an output gain from being influenced when the first and second transducing elements 31 and 33 are in resonance. In other words, each of the transducing elements 31 and 33 includes a piezoelectric body and a metal plate adhered to the piezoelectric body by the thermosetting gel or the UV gel, so as to reduce the frequency of resonance nodes. Further, the connection element 35 is made of rigid metal material. According to a preferred embodiment, the connection element 35 is made of rigid metal conductive material, and is used for electrically connecting the first transducing element 31 to the second transducing element 33. A resonance circuit 7 (shown in FIG. 3) outputs multiple frequency selection via the rigid metal conductive connection element 35 to the first piezoelectric transducer 311 and the piezoelectric transducer 331. The transducing elements, if having different sizes and thickness, will generate different composite mode vibrations in the thickness direction.

Figure 2B:
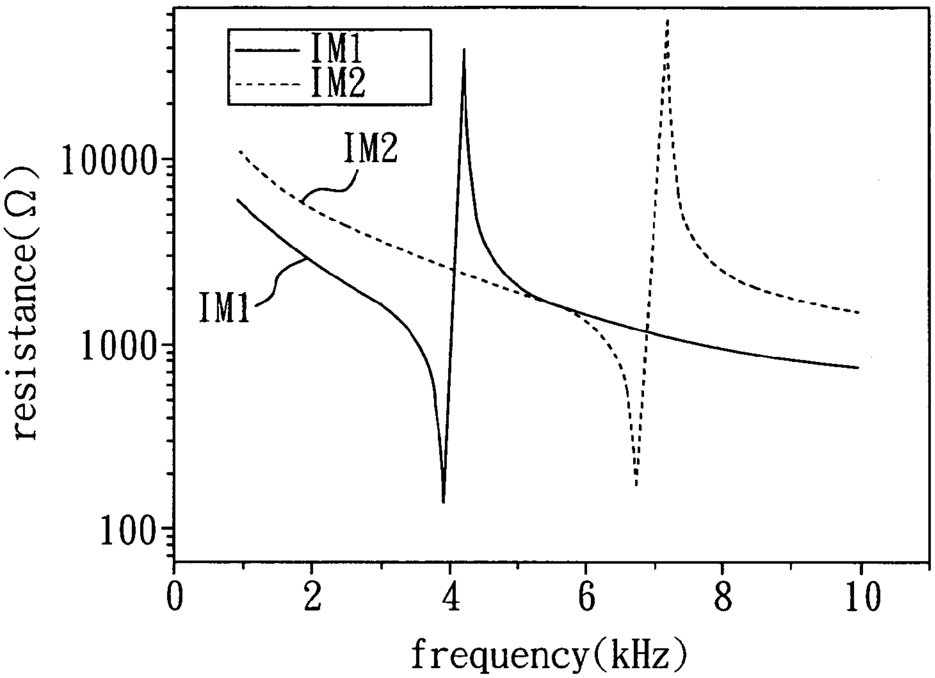
FIG. 2*b* is a frequency response schematic diagram of two transducing elements.
Figure 2C:
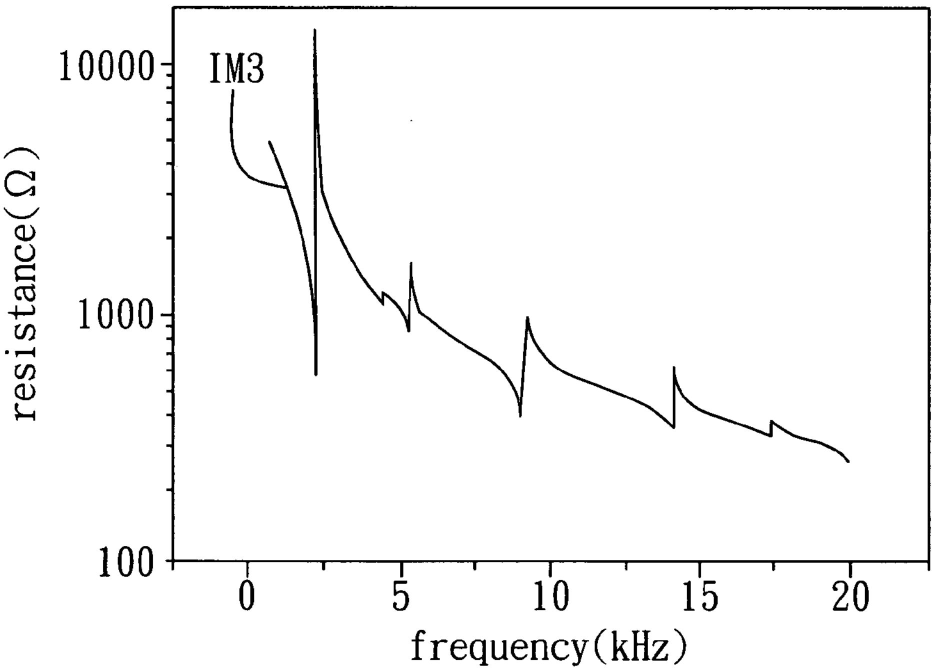
FIG. 2*c* is a frequency response schematic diagram of a composite mode transducer of the present invention.

Refer to FIG. 2*b*. A frequency response IM1 of the first piezoelectric transducer 311 is lower in the thickness direction than another frequency response IM2 of the second piezoelectric transducer 331. The higher the frequency, the less clearer the frequency response becomes, and the unclear frequency response is useless. FIG. 2*c* is a frequency response schematic diagram of the composite mode transducer of the present invention. The composition of the first and second transducing elements 31 and 33 enables the composite mode transducer to generate an addition and a subtraction of resonance frequencies of the first and second transducing elements 31 and 33. Therefore, a frequency response IM3 of the composite mode transducer can have closer resonance nodes for design usage, and the transducing module 3 can output different composite modes.

Figure 3:
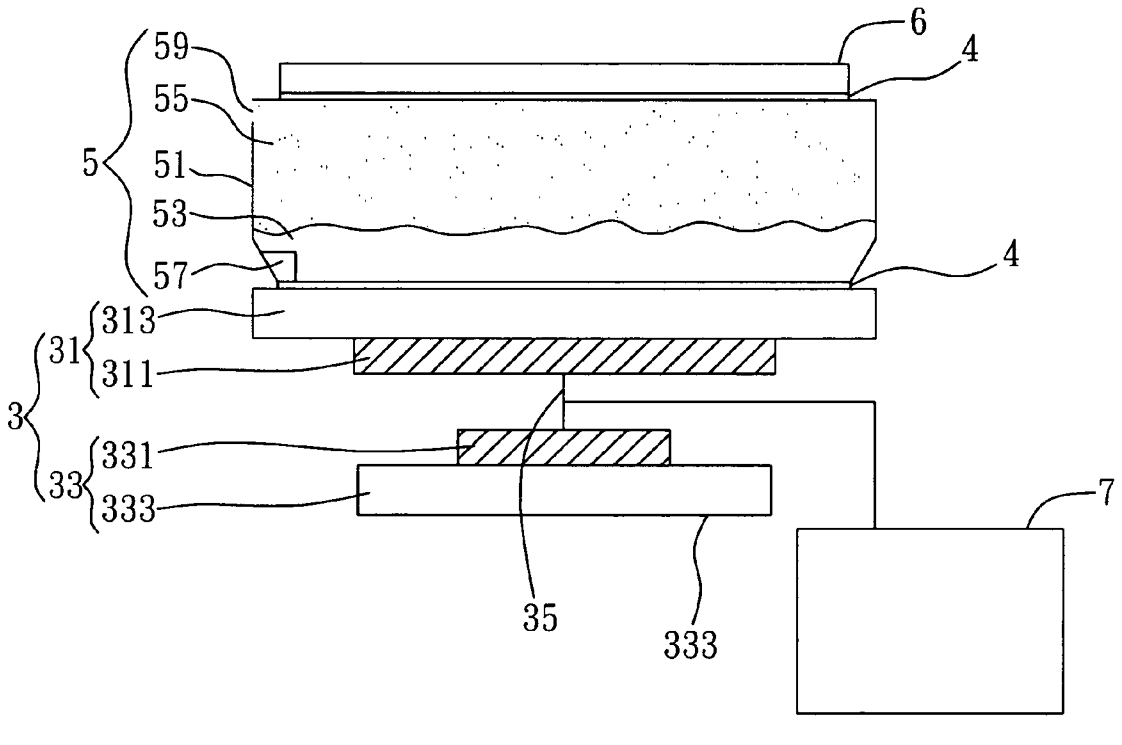
FIG. 3 is a schematic diagram of a composite mode transducer and a cooling device having the composite mode transducer of the present invention.
Figure 4:
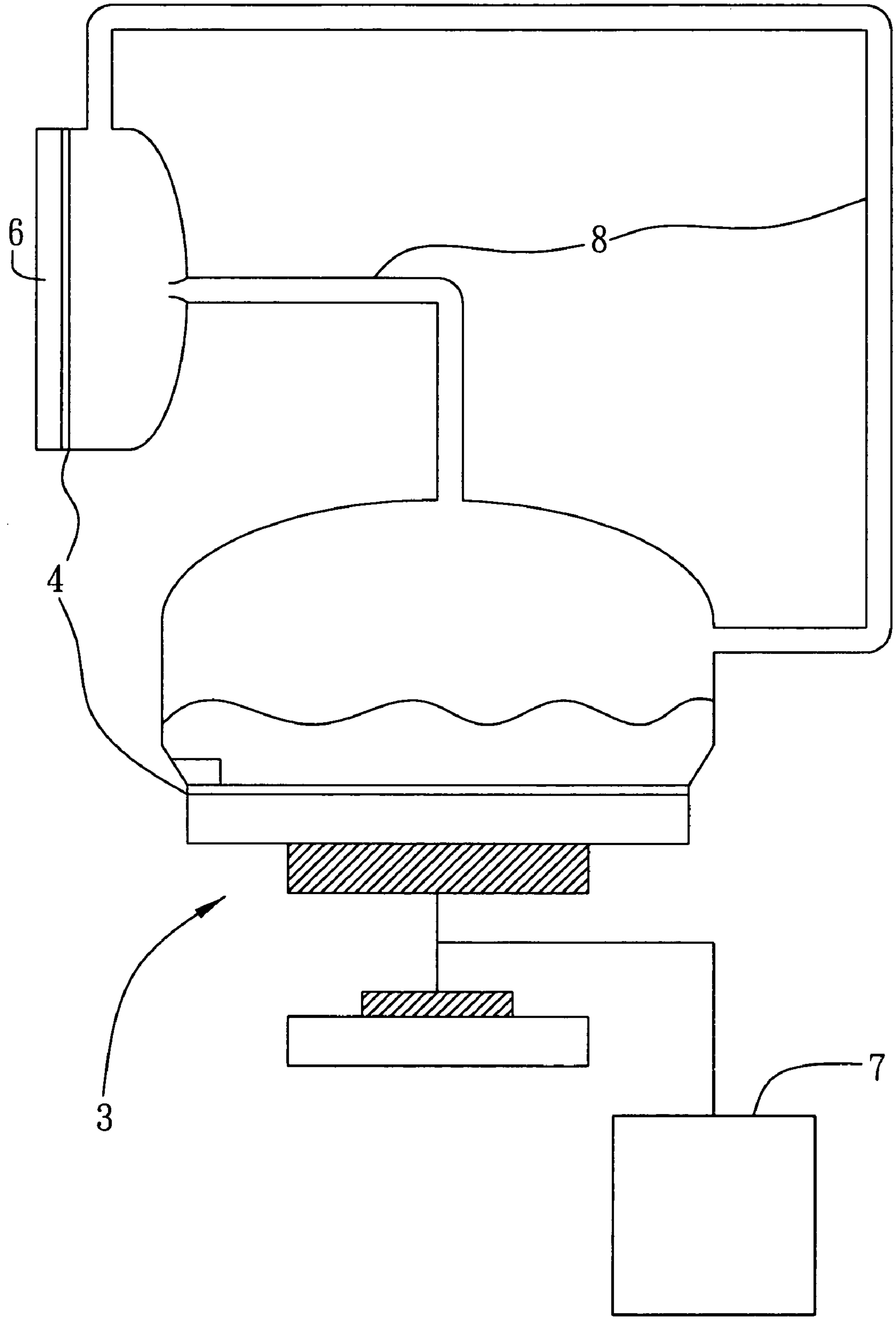
FIG. 4 is a schematic diagram of a composite mode transducer and a cooling device having a flexible spray pipe of the present invention.

Please refer to FIG. 3, which is a schematic diagram of a composite mode transducer and a cooling device having the composite mode transducer of the present invention. The cooling device includes a heat exchange module 5 and a composite mode transducer 3. The heat exchange module comprises an accommodation region 51, a liquid 53, a level switch 57 and an injection hole 59. The composite mode transducer 3 comprises the first transducing element 31 and the second transducing element 33 in parallel with the first transducing element 31, and the connection element 35 connected to standing points of the first and second transducing elements 31 and 33 when the first and second transducing elements 31 and 33 are in resonance. In operation, the liquid 53, as a heat exchange medium, is injected via the injection hole 59 into the accommodation region 51, and atomized by the transducing module 3 with different composite mode resonances into a plurality of atomized liquid droplets 55, which will be sprayed directly on adhered conduction surfaces of the heat generating element 6 and the heat exchange module 5, to perform a latent heat exchange with these microdroplets. Preferably, a heat conduction gel (thermal interface material) is filled in a gap between the heat generating element 6 and the heat exchange module 5 and adhered to a surface of the heat generating element 6, to obtain a better heat conduction efficiency. The heat generating element 6 can be clamped and adhered to the heat exchange module 5 by a metal fixing ring. Moreover, the present invention can further take the use of a flexible pipe 8, together with a pressure region such as a fan, to spray the atomized liquid droplets 55 via a spray nozzle on to a neighboring heat generating surface, as to in FIG. 4, to solve a problem if the heat generating surface is not installed horizontally. According to a preferred embodiment, a heat sink is installed on an external surface of the heat exchange module 5, and a metal fixing ring is used for clamping the heat sink to the heat exchange module 5. The transducing module 3 atomizes the liquid 53 accommodated in an accommodation unit and takes the atomized liquid as heat exchanging medium. Moreover, the heat exchange module 5 further includes a level switch component for preventing the leakage of the liquid 53, so as to protect the composite mode transducer from burning. Therefore, by the installation of the transducing module having the first transducing element and the second transducing element in parallel with the first transducing element, the connection element connected between a plurality of transducing element nodes, and the heat exchange module installed on a side of the composite mode transducer, the system, if operates in a high temperature environment, adopts lower composite frequency to drive the composite mode transducing module to generate liquid droplets having larger particles, such a resonance frequency consuming more power but dissipating more heat. The system, if operates in a low temperature environment, adopts higher composite frequency to drive the composite mode transducing module to generate liquid droplets having smaller particles, to dissipating less heat but consuming less power.

Compared with the prior art, the present invention discloses a composite mode transducer and a cooling device having the composite mode transducer, which takes use of a multiple-frequency resonance circuit to drive a first and second transducing elements, so as to generate different transducing module composite modes in a system resonance frequency. Preferably, the multiple-frequency resonance circuit is designed in accordance with resonance nodes of the transducing elements of the system after the transducing elements are composed. The multiple-frequency resonance circuit further drives the first and second transducing element, so as to generate an atomized effect of composite mode. Moreover, the present invention uses piezoelectric actuators of different sizes and thickness to generate different composite mode vibration in the thickness direction and generate atomized liquid droplets disposed pre-determinedly. The atomized liquid droplets are sprayed on a heat generating adhering surface directly, or by a spray nozzle via a flexible pipe and a pressure region such as a fan onto a neighboring heat generating surface, to perform a latent heat exchange with these micro-droplets. Therefore, the disposition of the atomized liquid droplets can be adjusted according to a system temperature, to increase the heat exchanging efficiency and prevent environment factors from affecting the system. The resonance effect of a composite mode formed by the connection of the first and second transducing elements prevents stress forces from converging on certain regions, so as to promote system working efficiency and working stability.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A composite mode transducer comprising:

a transducing module having a first transducing etement and a second transducing element in parallel with the first transducing element, wherein the transducing element comprising a piezoelectric body being adhered to a metal board, for transforming input powers into vibration outputs in a thickness direction; and a connection element connected to resonance nodes of the first and second transducing elements for conducting the first and second transducing elements, and composing modes generated by the first and second transducing elements into a system resonance mode.

2. The composite mode transducer of claim 1 comprising a plurality of connected transducing modules.

3. The composite mode transducer of claim 1, wherein the piezoelectric body is made of a piezoelectric ceramic material.

4. The composite mode transducer of claim 1, wherein the piezoelectric body is adhered to the metal plate by one selected from the group a thermosetting gel and an ultraviolet (UV) gel.

5. The composite mode transducer of claim 1, wherein the connection element is made of a rigid metal material.

6. The composite mode transducer of claim 1, wherein the connection element is made of a conductive material, and is used for electrically connecting the first and second transducing elements.

7. The composite mode transducer of claim 1 further comprising a multiple-frequency resonance circuit.

8. The composite mode transducer of claim 7, wherein the multiple-frequency resonance circuit is used for outputting one selected from the group consisting of a resonance frequency of the first transducing element, a resonance frequency of the second transducing element, a frequency by subtracting the resonance frequency of first transducing element from the resonance frequency of the second transducing element, and a frequency by adding the resonance frequency of the first transducing element to the resonance frequency of the second transducing element.

* * * * *